US012092839B2

(12) United States Patent
Chen et al.

(10) Patent No.: US 12,092,839 B2
(45) Date of Patent: *Sep. 17, 2024

(54) MULTIFUNCTIONAL COLLIMATOR FOR CONTACT IMAGE SENSORS

(71) Applicant: Taiwan Semiconductor Manufacturing Co., Ltd., Hsin-Chu (TW)

(72) Inventors: Hsin-Yu Chen, Hsinchu (TW); Chun-Peng Li, Hsinchu (TW); Chia-Chun Hung, Hsinchu (TW); Ching-Hsiang Hu, Taipei (TW); Wei-Ding Wu, Zhubei (TW); Jui-Chun Weng, Taipei (TW); Ji-Hong Chiang, Changhua (TW); Yen Chiang Liu, Hsinchu (TW); Jiun-Jie Chiou, Hsinchu (TW); Li-Yang Tu, Hsinchu (TW); Jia-Syuan Li, Hsinchu (TW); You-Cheng Jhang, Hsinchu (TW); Shin-Hua Chen, Hsinchu (TW); Lavanya Sanagavarapu, Hsinchu (TW); Han-Zong Pan, Hsinchu (TW); Hsi-Cheng Hsu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/222,344

(22) Filed: Jul. 14, 2023

(65) Prior Publication Data

US 2023/0359056 A1 Nov. 9, 2023

Related U.S. Application Data

(63) Continuation of application No. 17/881,439, filed on Aug. 4, 2022, now Pat. No. 11,726,342, which is a
(Continued)

(51) Int. Cl.
*G02B 27/30* (2006.01)
*H01L 27/146* (2006.01)
*H01L 31/0232* (2014.01)

(52) U.S. Cl.
CPC ........ *G02B 27/30* (2013.01); *H01L 27/14625* (2013.01); *H01L 31/02325* (2013.01)

(58) Field of Classification Search
CPC ........ G02B 27/30; G02B 5/20; G02B 26/007; G06K 9/00033; G06K 9/0004;
(Continued)

(56) References Cited

U.S. PATENT DOCUMENTS 9,496,435 B2 11/2016 Wang et al.
9,728,662 B2 8/2017 Lo et al.
(Continued)

FOREIGN PATENT DOCUMENTS

CN 107078145 A 8/2017
TW 201137998 A 11/2011
TW 201531747 A 8/2015

*Primary Examiner* — John R Lee
(74) *Attorney, Agent, or Firm* — Duane Morris LLP

(57) ABSTRACT

Disclosed is a method to fabricate a multifunctional collimator structure In one embodiment, an optical collimator, includes: a dielectric layer; a substrate; and a plurality of via holes, wherein the dielectric layer is formed over the substrate, wherein the plurality of via holes are configured as an array along a lateral direction of a first surface of the dielectric layer, wherein each of the plurality of via holes extends through the dielectric layer and the substrate from the first surface of the dielectric layer to a second surface of the substrate in a vertical direction, wherein the substrate has a bulk impurity doping concentration equal to or greater than $1\times10^{19}$ per cubic centimeter ($cm^{-3}$) and a first thickness, and wherein the bulk impurity doping concentration and the first thickness of the substrate are configured so as to allow the optical collimator to filter light in a range of wavelengths.

20 Claims, 10 Drawing Sheets

Related U.S. Application Data continuation of application No. 16/655,763, filed on Oct. 17, 2019, now Pat. No. 11,448,891.

(58) Field of Classification Search
CPC .......... H01L 27/14601; H01L 27/1462; H01L 27/14621; H01L 27/14625; H01L 27/14627; H01L 27/146; H01L 31/02162; H01L 31/02325; H01L 31/02327; H01L 31/0232; B32B 2551/00
See application file for complete search history.

(56) References Cited

U.S. PATENT DOCUMENTS

| | | |
|---|---|---|
| 10,867,198 B2 | 12/2020 | Chung et al. |
| 11,126,305 B2 | 9/2021 | Xiang et al. |
| 11,448,891 B2 | 9/2022 | Chen et al. |
| 11,454,820 B2 | 9/2022 | Chen et al. |
| 11,514,707 B2 * | 11/2022 | Jhang .................... G02B 27/30 |
| 11,726,342 B2 * | 8/2023 | Chen ...................... G02B 5/208 |
| | | 359/641 |
| 11,782,284 B2 * | 10/2023 | Chen .................. G06V 40/1312 |
| | | 257/435 |
| 11,861,928 B2 * | 1/2024 | Jhang .................... G06F 3/0412 |
| 2003/0076499 A1 | 4/2003 | Yamada et al. |
| 2003/0128813 A1 | 7/2003 | Appleby et al. |
| 2005/0073019 A1 | 4/2005 | Lee et al. |
| 2005/0161589 A1 | 7/2005 | Kim et al. |
| 2005/0286024 A1 | 12/2005 | Gupta |
| 2007/0161186 A1 | 7/2007 | Ho |
| 2010/0029027 A1 | 2/2010 | Ikuta et al. |
| 2010/0277789 A1 | 11/2010 | Wu et al. |
| 2011/0315988 A1 | 12/2011 | Yu et al. |
| 2012/0229759 A1 | 9/2012 | Tamura et al. |
| 2017/0315110 A1 | 11/2017 | Chou |
| 2019/0006407 A1 | 1/2019 | Uesaka |
| 2019/0148145 A1 | 5/2019 | Huang et al. |
| 2019/0148437 A1 | 5/2019 | Cheng et al. |
| 2019/0157337 A1 | 5/2019 | Lin et al. |
| 2019/0305019 A1 | 10/2019 | Chen et al. |
| 2019/0347462 A1 | 11/2019 | Tseng et al. |
| 2019/0348455 A1 | 11/2019 | Cheng et al. |
| 2020/0285345 A1 | 9/2020 | Xiang et al. |
| 2020/0387686 A1 | 12/2020 | Jhang et al. |
| 2021/0116713 A1 | 4/2021 | Chen et al. |
| 2021/0116714 A1 | 4/2021 | Chen et al. |
| 2022/0004280 A1 | 1/2022 | Xiang et al. |
| 2022/0373815 A1 | 11/2022 | Chen et al. |
| 2023/0092567 A1 * | 3/2023 | Jhang .................... G06F 3/0412 |
| | | 455/557 |
| 2023/0359056 A1 * | 11/2023 | Chen ................. H01L 27/14678 |
| 2023/0400699 A1 * | 12/2023 | Chen ........................ G02B 5/20 |
| 2023/0401885 A1 * | 12/2023 | Jhang .................... G02B 27/30 |

\* cited by examiner

MULTIFUNCTIONAL COLLIMATOR FOR CONTACT IMAGE SENSORS

RELATED APPLICATION

This application is a continuation of U.S. patent application Ser. No. 17/881,439, filed Aug. 4, 2022 which is a continuation of U.S. patent application Ser. No. 16/655,763, filed Oct. 17, 2019, now U.S. Pat. No. 11,448,891, the entirety of which is incorporated by reference herein.

BACKGROUND

In order to prevent noises from ambient infrared (IR) sources, a contact image sensor (CIS), e.g., a finger print sensor, typically employs a glass filter. The glass filter in such application is typically thick (e.g., 400-500 micrometers) so as to provide efficient filtering of ambient IR noises especially at high incident angles (>15 degree). This results in a bulky assembly and high cost. There exists a need to develop a cost-effective method to filter ambient infrared light to reduce noises in contact image sensors.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

A thick IR glass can be used to filter undesired ambient noises for a CIS sensor. This design results in a bulky structure and increases a cost of such CIS sensor. This disclosure presents various embodiments of a method for integrating a filter function to a collimator for contact image sensors to simultaneously align incident light and filter ambient noises with a compact design and low cost.

Figure 1:
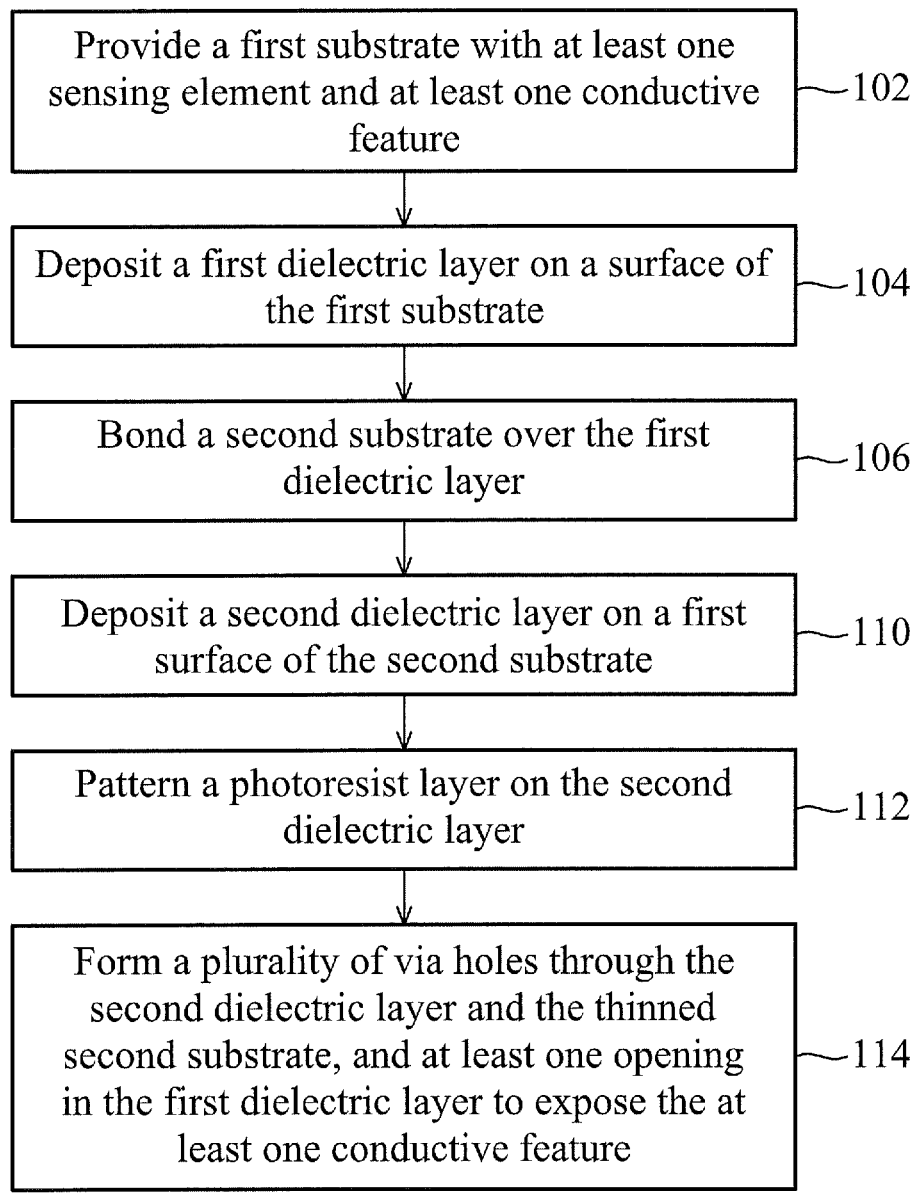
FIG. 1 illustrates a flow chart of an exemplary method for forming a semiconductor device, in accordance with some embodiments of the present disclosure.

FIG. 1 illustrates a flowchart of a method 100 to form a multifunctional collimator structure on a semiconductor device, in accordance with some embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A, 2B, 2C, 2D, 2E, and 2F, respectively, which will be discussed in further detail below.

Referring now to FIG. 1, the method 100 starts with operation 102 in which a first substrate is provided according to some embodiments. In some embodiments, the first substrate comprises at least one optical sensing element and at least one conductive feature for contacting purposes. The method 100 continues with operation 104 in which a first dielectric layer is deposited on the surface of the first substrate according to some embodiments. In some embodiments, the first dielectric layer comprises silicon dioxide is for planarization purposes. In some embodiments, the first dielectric layer also provides a Si-to-oxide fusion-bond surface. In some embodiments, a shallow opening (i.e., partial etching in the first dielectric layer) is also performed. The method 100 continues with operation 106 in which a second substrate is bonded over the first dielectric layer on the first substrate according to some embodiments. In some embodiments, the second substrate is bonded to the first dielectric layer through a wafer bonding process. In some embodiments, the second substrate is a p-type or n-type silicon substrate with a bulk impurity doping level equal to or greater than $1\times10^{19}$ cm$^{-3}$. The method 100 continues with operation 108 in which the second substrate is thinned down according to some embodiments. In some embodiments, the thinned second substrate has a thickness, wherein the thickness is equal to or greater than 75 micrometers. The method 100 continues with operation 110 in which a second dielectric layer is deposited on a first surface of the thinned second substrate according to some embodiments. In some embodiments, the second dielectric layer comprises silicon dioxide. The method 100 continues with operation 112 in which a photoresist layer is patterned on the second dielectric layer according to some embodiments. In some embodiments, the patterned photoresist layer provides a pattern of a collimator structure. The method 100 continues with operation 114 in which a plurality of via holes through the second dielectric layer and the thinned second substrate is formed according to some embodiments. In some embodiments, the plurality of via holes is formed by etching the second dielectric layer using the patterned first photoresist layer as a soft mask followed by etching the thinned second substrate using the patterned second dielectric layer as a hard mask. In some embodiments, at least one opening is also etched in the first dielectric layer so as to expose the at least one conductive feature in the first substrate for contacting purposes. In some embodiments, a chemical etching process is performed so as to remove the photoresist layer. In some embodiments, the semiconductor device with the first substrate and the collimator structure through the second dielectric layer and the thinned second substrate is then wafer diced to form a plurality of dies. In some embodiments, each of the plurality of dies is then wafer bonded to a third substrate and further wire bonded. In some embodiments, each of the plurality of dies is embedded in a molding and packaged.

As mentioned above, FIGS. 2A-2F illustrate, in a cross-sectional view, a portion of a semiconductor device 200 at various fabrication stages of the method 100 of FIG. 1. The semiconductor device 200 may be included in an integrated circuit (IC). Also, FIGS. 2A-2F are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2F, for purposes of clarity of illustration.

Figure 2A:
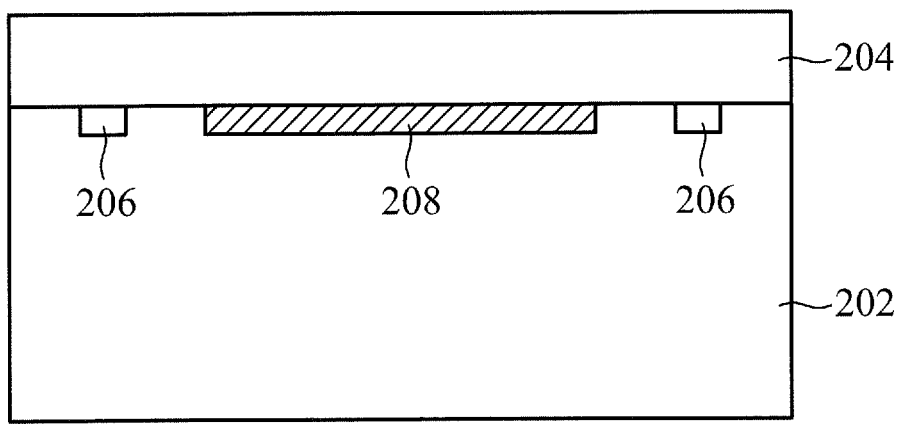
FIGS. 2A, 2B, 2C, 2D, 2E, and 2F, illustrate cross-sectional views of an exemplary semiconductor device with a collimator during various fabrication stages, made by the method of FIG. 1, in accordance with some embodiments of the present disclosure.

FIG. 2A is a cross-sectional view of the semiconductor device 200 including a first substrate 202 and a first dielectric layer 204 at one of the various stages of fabrication corresponding to operations 102 and 104 of FIG. 1, in accordance with some embodiments of the present disclosure. In some embodiments, the first substrate 202 comprises at least one optical sensing element (not shown) in an optical sensing element region 208. In some embodiments, the at least one optical sensing element each is a Contact Image Senor (CIS). In some embodiments, the CIS is an image sensor used in direct contact with the object to be imaged or scanned. In some embodiments, the CIS comprises a plurality of detectors. In some embodiments, the plurality of detectors detects light directed from an object surface. In some embodiments, the plurality of detectors each comprises one of the following: a Charge Coupled Device (CCD) sensor and a Complementary metal-oxide semiconductor (CMOS) sensor. In some embodiments, the first substrate 202 further comprises 2 conductive features 206.

In some embodiments, the first substrate 202 is a silicon substrate. Alternatively, the first substrate 202 may include other elementary semiconductor material such as, for example, germanium. The first substrate 202 may also include a compound semiconductor such as silicon carbide, gallium arsenic, indium arsenide, and indium phosphide. The first substrate 202 may include an alloy semiconductor such as silicon germanium, silicon germanium carbide, gallium arsenic phosphide, and gallium indium phosphide. In one embodiment, the first substrate 202 includes an epitaxial layer. For example, the first substrate 202 may have an epitaxial layer overlying a bulk semiconductor. Furthermore, the first substrate 202 may include a semiconductor-on-insulator (SOI) structure. For example, the first substrate 202 may include a buried oxide (BOX) layer formed by a process such as separation by implanted oxygen (SIMOX) or other suitable technique, such as wafer bonding and grinding.

In some embodiments, the first substrate 202 also includes various p-type doped regions and/or n-type doped regions, implemented by a process such as ion implantation and/or diffusion. Those doped regions include n-well, p-well, lightly doped region (LDD), heavily doped source and drain (S/D), and various channel doping profiles configured to form various integrated circuit (IC) devices, such as a CMOS field-effect transistor (CMOS-FET), imaging sensor, and/or light emitting diode (LED). The first substrate 202 may further include other functional features such as a resistor or a capacitor formed in and on the substrate. The first substrate 202 further includes lateral isolation features provided to separate various devices formed in the first substrate 202, for example shallow trench isolation (STI). The various devices in the first substrate 202 further include silicide disposed on S/D, gate and other device features for reduced contact resistance and enhance process compatibility when coupled between devices through local interconnections.

In some embodiment, at least one conductive feature is included in the first substrate 202. In some embodiments, the at least one conductive feature can be a source, drain or gate electrode. Alternatively, the at least one conductive feature may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or by on source/drain (typically known as "salicide") by a self-aligned silicide technique. In another embodiment, the at least one conductive feature may include an electrode of a capacitor or one end of a resistor. In another embodiment, the at least one conductive feature is a contact to the CIS sensor in the first substrate 202.

In some embodiments, the first dielectric layer 204 comprises a material that is at least one of the following: silicon dioxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the first dielectric layer 204 is deposited using plasma enhanced chemical vapor deposition (PECVD) with a silane gas as a precursor gas. In some other embodiments, the first dielectric layer 204 is deposited using a physical vapor deposition (PVD) process.

Figure 2B:
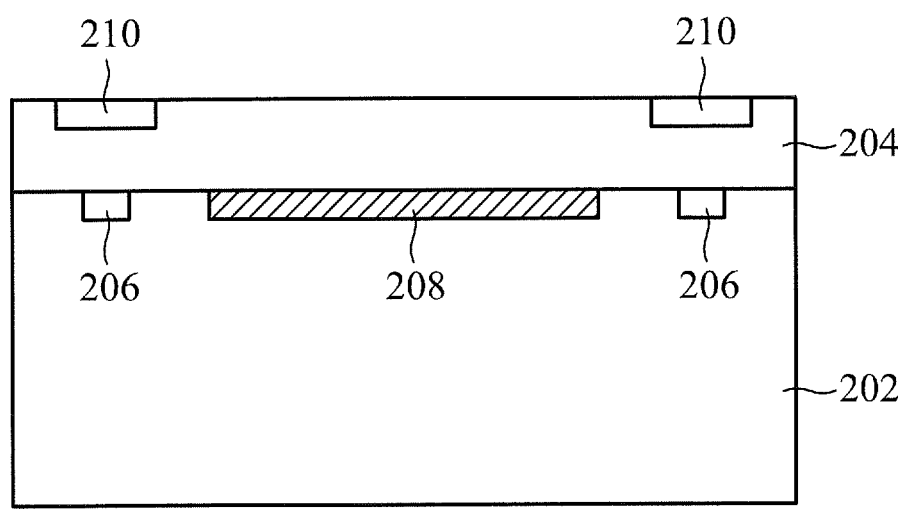

FIG. 2B is a cross-sectional view of the semiconductor device 200 including the first substrate and the first dielectric layer 204 at one of the various stages of fabrication that corresponds to operation 104 of FIG. 1, in accordance with some embodiments. In the illustrated embodiment, 2 shallow openings 210 in the first dielectric layer 204 at positions corresponding to the 2 conductive features in the first substrate 202 are created. In some embodiments, a photolithographic process is performed and a dry or wet etching is used to perform a partial etching in the first dielectric layer.

Figure 2C:
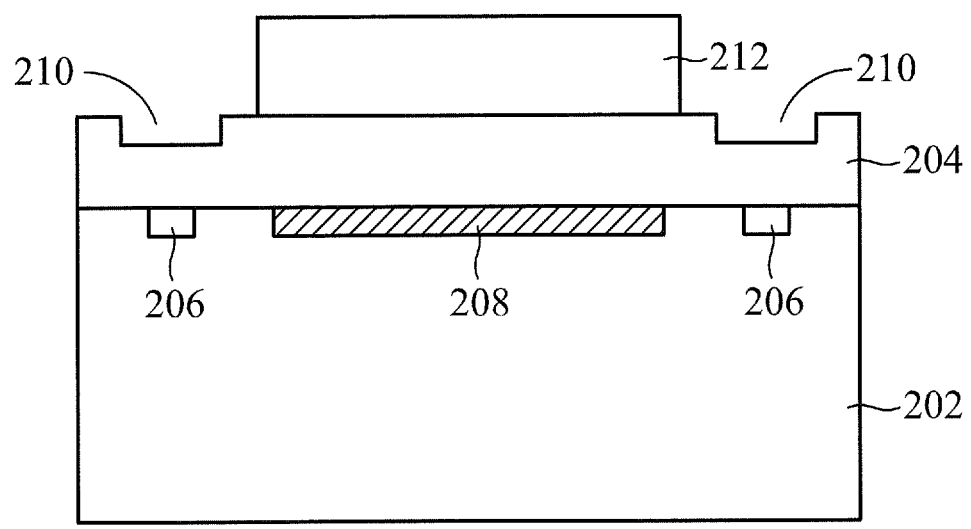

FIG. 2C is a cross-sectional view of the semiconductor device 200 including the first substrate 202, the first dielectric layer 204 and a second substrate 206 at one of the various stages of fabrication that corresponds to operation 106 of FIG. 1, in accordance with some embodiments of the present disclosure. In some embodiments, the second substrate 206 includes a silicon substrate. In some embodiments, the second substrate 212 is a p-type substrate or an n-type substrate with an impurity doping level (i.e., carrier concentration) equal to or greater than $1 \times 10^{19}$ cm$^{-3}$. A high concentration of impurity doping in the second substrate results in an increased light absorption in the near Infrared (IR) region due to a band gap shift, which affects both phonon-assisted absorption, and free-carrier absorption. Therefore, the use of the second substrate with a high carrier concentration can be used to reduce noise by limiting the ambient near IR light from reaching the at least one optical sensing element in the first substrate. Alternatively, the second substrate 206 may include other elementary semiconductor material according to the optical properties of the materials, such as, for example, germanium. The second substrate 206 may also include a compound semiconductor such as silicon carbide, gallium arsenic, indium arsenide, and indium phosphide. The second substrate 206 may include an alloy semiconductor such as silicon germanium, silicon germanium carbide, gallium arsenic phosphide, and gallium indium phosphide. In some embodiments, a selection of the second substrate and its impurity doping concentration can be determined according to a desired working wavelength range, e.g., between 780 nanometers and 1100 nanometers. In one embodiment, the second substrate 206 includes an epitaxial layer. For example, the second substrate 206 may have an epitaxial layer overlying a bulk semiconductor. Furthermore, the second substrate 206 may include a semiconductor-on-insulator (SOI) structure. For example, the second substrate 206 may include a buried oxide (BOX) layer formed by a process such as separation by implanted oxygen (SIMOX) or other suitable technique, such as wafer bonding and grinding.

In some embodiments, the second substrate 212 is bonded to the first dielectric layer 204 in a region corresponding to the optical sensing region 208 through a wafer bonding process. In some embodiments, the wafer bonding process is a direct bonding without any additional intermediate layers. In some embodiments, the wafer bonding process comprises at least one of the following steps: surface preprocessing, pre-bonding at room temperature, and annealing at elevated temperatures. In another embodiment, surface activation can be used so as to avoid high temperature annealing.

Figure 2D:
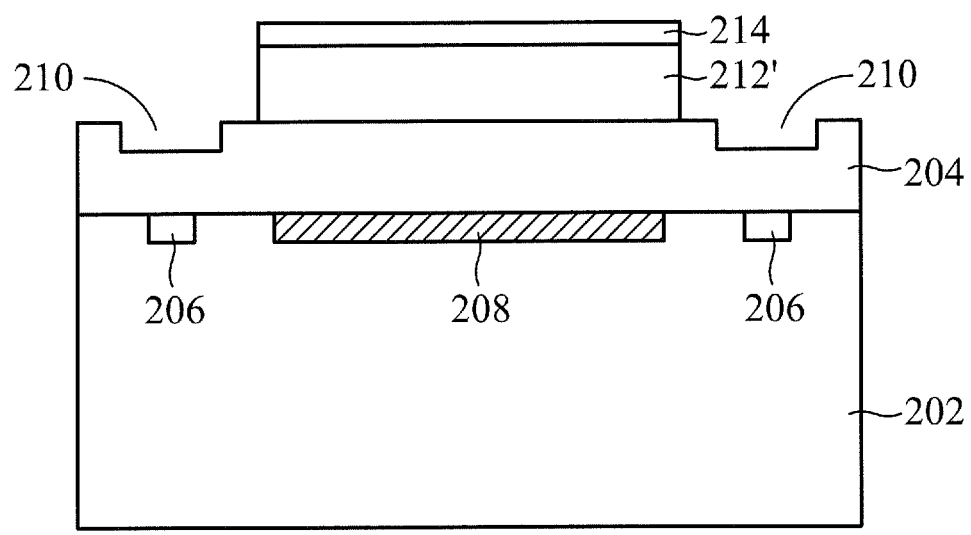

FIG. 2D is a cross-sectional view of the semiconductor device 200 including a second dielectric layer 214 over a thinned second substrate 212' at one of the various stages of fabrication that corresponds to operations 108 and 110 of FIG. 1, in accordance with some embodiments of the present disclosure. In some embodiments, the second substrate 212 after bonding to the first dielectric layer 204 on the first substrate 202 is further thinned down to obtain a first thickness, wherein the first thickness is determined according to an absorption coefficient in the desired filtering wavelength range (between 780 nanometers and 1100 nanometers). In some embodiments, the absorption coefficient in $cm^{-1}$ of the second substrate 212 is a function of the impurity doping concentration of the second substrate and its bandgap. For example, when the second substrate is a silicon substrate, with an increasing doping concentration, the band gap of the second substrate reduces and the absorption coefficient increases. In some embodiments, the second substrate 206 is etched by a dry and/or wet etching process. In some embodiments, the thinned second substrate 212' has a thickness which is equal to or greater than 75 micrometer. In some embodiments, the second dielectric layer 214 is deposited on the thinned second substrate 212. In some embodiments, the second dielectric layer 214 comprises a material that is least one of the following: silicon dioxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the second dielectric layer 208 is deposited using plasma enhanced chemical vapor deposition (PECVD) with a silane gas as a precursor gas. In some other embodiments, the second dielectric layer 208 is deposited using a physical deposition process, e.g., sputtering and evaporation. In some embodiments, the second dielectric layer 214 is deposited using an atomic layer deposition (ALD) process. In some embodiments, the second dielectric layer 214 has a thickness equal to or greater than 3 micrometers. In some embodiments, the surface of the second substrate that is not in direct contact with the first dielectric layer 204 after etching is further planarized through a Chemical-Mechanical Polishing (CMP) process before the deposition of the second dielectric layer 214.

Figure 2E:
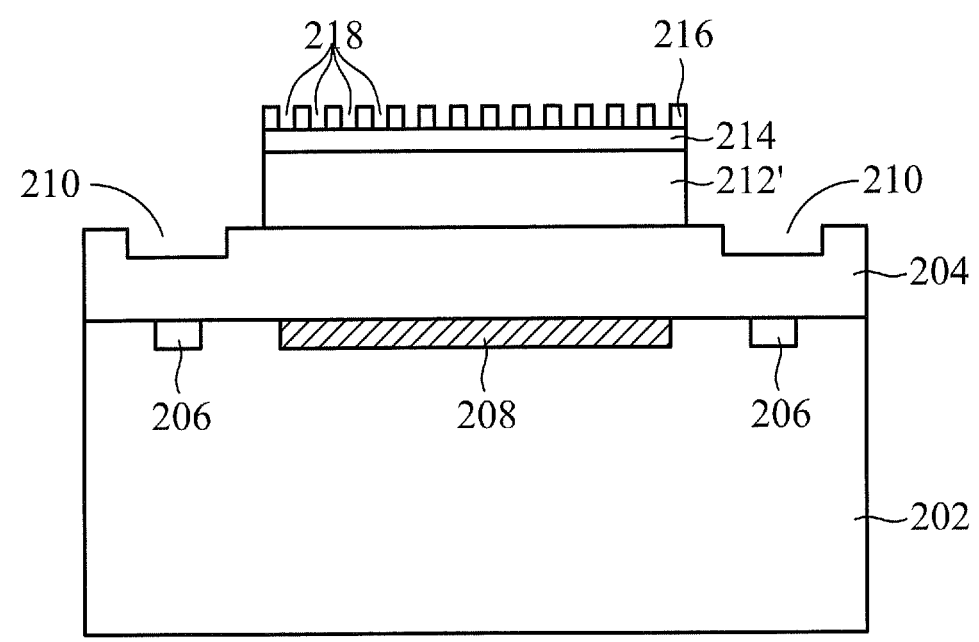

FIG. 2E is a cross-sectional view of the semiconductor device 200 in which a photoresist layer 216 is patterned on the second dielectric layer 214 at one of the various stages of fabrication that corresponds to operation 112 of FIG. 1, in accordance with some embodiments of the present disclosure. As described below, the patterned photoresist layer 216 with a plurality of openings 218 is used to mask an etching of the second dielectric layer 214 and the thinned second substrate 212' to form a plurality of via holes (i.e., a collimator structure) on top of the first dielectric layer 204 on the first substrate 202. Accordingly, in some embodiments, the patterned photoresist layer 216 is formed after a conventional patterning (e.g., photolithography) process, to align the collimate structure with the at least one optical sensing element in the optical sensing region 208 of the first substrate 202.

In some embodiments, an initial photoresist layer 216 before the patterning process may include a negative or positive tone photoresist layer that is patternable in response to a photolithography light source. In some alternative embodiments, the initial photoresist layer 210 may include an e-beam (electron beam) resist layer (e.g., poly methyl methacrylate, methyl methacrylate, etc.) that is patternable in response to an e-beam lithography energy source. In some embodiments, the initial photoresist layer 216 is formed over the second dielectric layer 214 using a deposition process known in the art such as spin-coating, spray-coating, dip-coating, roller-coating, or the like. The initial photoresist layer 216 is then patterned in a lithography process that may involve various exposure, developing, baking, stripping, etching, and rinsing processes. As a result, the patterned photoresist layer 216 is formed such that a plurality of openings 218 expose at least a portion of the top surface of the second dielectric layer 214, as shown in FIG. 2E. In some embodiments, the plurality of openings 218 in the patterned photoresist layer 216 is circular and has a diameter of 4.2 micrometers. In some embodiments, the diameters of the plurality of openings 218 are in a range of 2-5 micrometers.

Figure 2F:
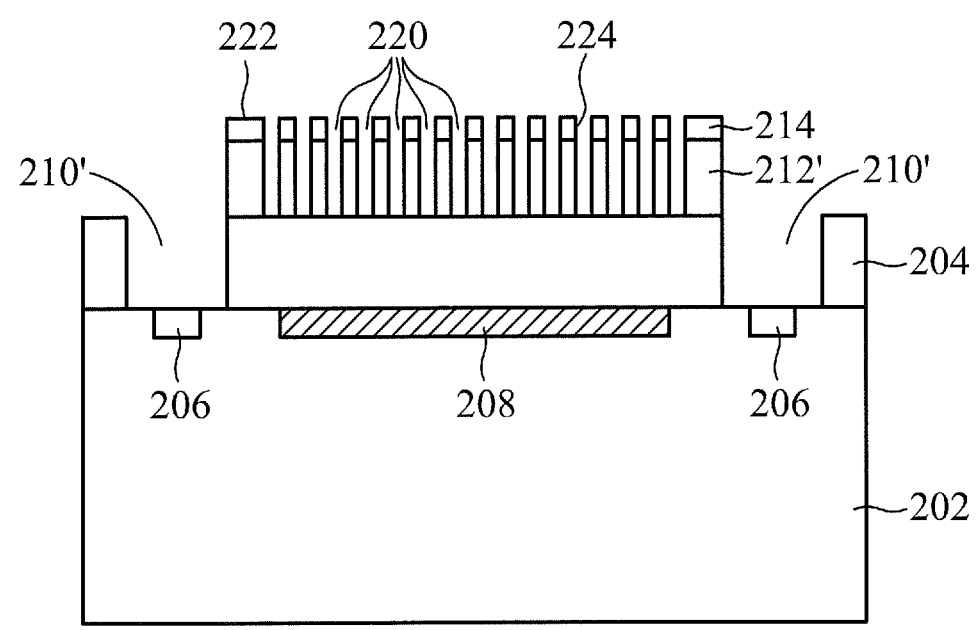

FIG. 2F is a cross-sectional view of the semiconductor device 200 in which a plurality of via holes 220 is formed in the second dielectric layer 214 and the thinned second substrate 212', the patterned photoresist layer 216 is removed and at least one conductive feature 206 is exin the posed through the first dielectric layer 204 at one of the various stages of fabrication that corresponds to operations 114 of FIG. 1, in accordance with some embodiments of the present disclosure. In some embodiments, the second dielectric layer 214 is first etched so as to transfer the pattern of the plurality of openings 218 in the patterned photoresist layer 216 to the second dielectric layer 214. In some embodiments, the thinned second substrate 212' is then further etched through the patterned second dielectric layer 214 so as to transfer the patterns in the second dielectric layer 214 to the thinned second substrate 212'. In some embodiments, the etching of the second dielectric layer 214 and the thinned second substrate 212' is performed by a dry and/or wet etching process.

In some embodiments, the patterned photoresist layer 216 is removed before the etching of the thinned second substrate 212'. In some embodiments, the patterned photoresist layer 216 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the patterned photoresist layer 216. The selection of the remover is determined by the type and chemical structure of the patterned photoresist layer 216, the second dielectric layer 214, as well as the thinned second substrate 212' to assure the chemical compatibility of these layers with the chemical cleaning process. In some embodiments, this cleaning process is then followed by a rinsing process using isopropyl alcohol or the like, followed by rinsing using deionized water. As a result of this process, the plurality of via holes 220, i.e., the collimator structure, are formed through the second dielectric layer 214 and the thinned second substrate 212'. In some embodiments, the collimator structure comprises a top surface 222 of the second dielectric layer 214 and sidewalls 224. In some embodiments, the at least one conductive feature 206 is exposed by etching the 2 partial openings 210 in the first dielectric layer 204 so as to provide an electric contact to the at least one optical sensing element in the optical sensing region 208 in the first substrate 202 using a wet or dry etching process.

In some embodiments, the collimator structure narrows incident light and allow the incident light to be aligned in a specific direction when the light arrives at the at least one optical sensing element in the optical sensing region 208 of the first substrate 202. Furthermore, the collimator structure created in the thinned second substrate 212' with an impurity doping concentration equal to or greater than $1 \times 10^{19}$ cm$^{-3}$ further allows to filter undesired ambient noises (e.g., near IR light) and prevent these noises from reaching the at least one optical sensing element. Therefore, the collimator structure in the present disclosure provides multiple functions allowing the use of regular glass during packaging and thus reducing the cost, and further allowing the use of CIS devices in space-limited applications.

Figure 3:
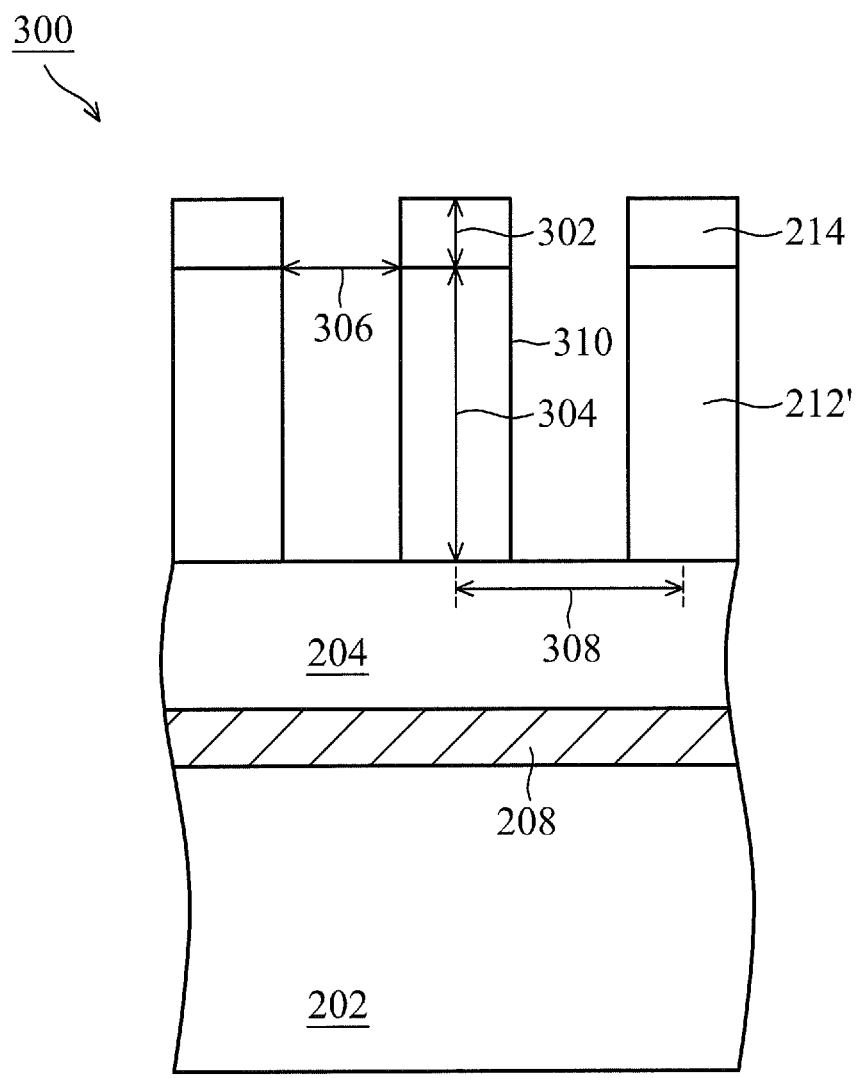
FIG. 3 illustrates an exemplary cross-sectional views of a semiconductor device with a collimator, in accordance with some embodiments of the present disclosure.

FIG. 3 illustrates an exemplary cross-sectional view of a semiconductor device 300 with a collimator structure, in accordance with some embodiments of the present disclosure. In the illustrated embodiment, the collimator structure is fabricated according to the method 100 described in FIG. 1. Specifically, the device 300 comprises a first substrate 202 with an optical sensing region 208, a first dielectric layer 204, and a plurality of via holes 220 in a thinned second substrate 212' and a second dielectric layer 214.

In some embodiments, the patterned second dielectric layer 214 has a thickness 302 in a range of 1.5-2.5 micrometers. In some embodiments, the thinned second substrate 212' has a thickness 304 in a range of 72-78 micrometers. In some embodiments, a diameter 306 of each of the plurality of via holes 220 is in a range of 3-5 micrometers. In some embodiments, a pitch size 308 is in a range of 2.6-3.4 micrometers.

In the illustrated embodiment, the sidewalls 310 of the plurality of via holes 220 etched into the second dielectric layer 214 and the thinned second substrate 212' are perpendicular to the exposed surface of the first dielectric layer 204. This profile obtained under ideal etching conditions with idea sidewalls passivation in the device 300 is for illustration purposes and not intend to be limiting. Practical etching conditions (i.e., etching rate in different directions) can cause effects such as tapering, undercutting, notching, bowing, rippling, etc., which alter the sidewall profile of the openings 220. It should be noted that different sidewall profiles that can be obtained from practical etching conditions are all within the scope of this invention.

Figure 4:
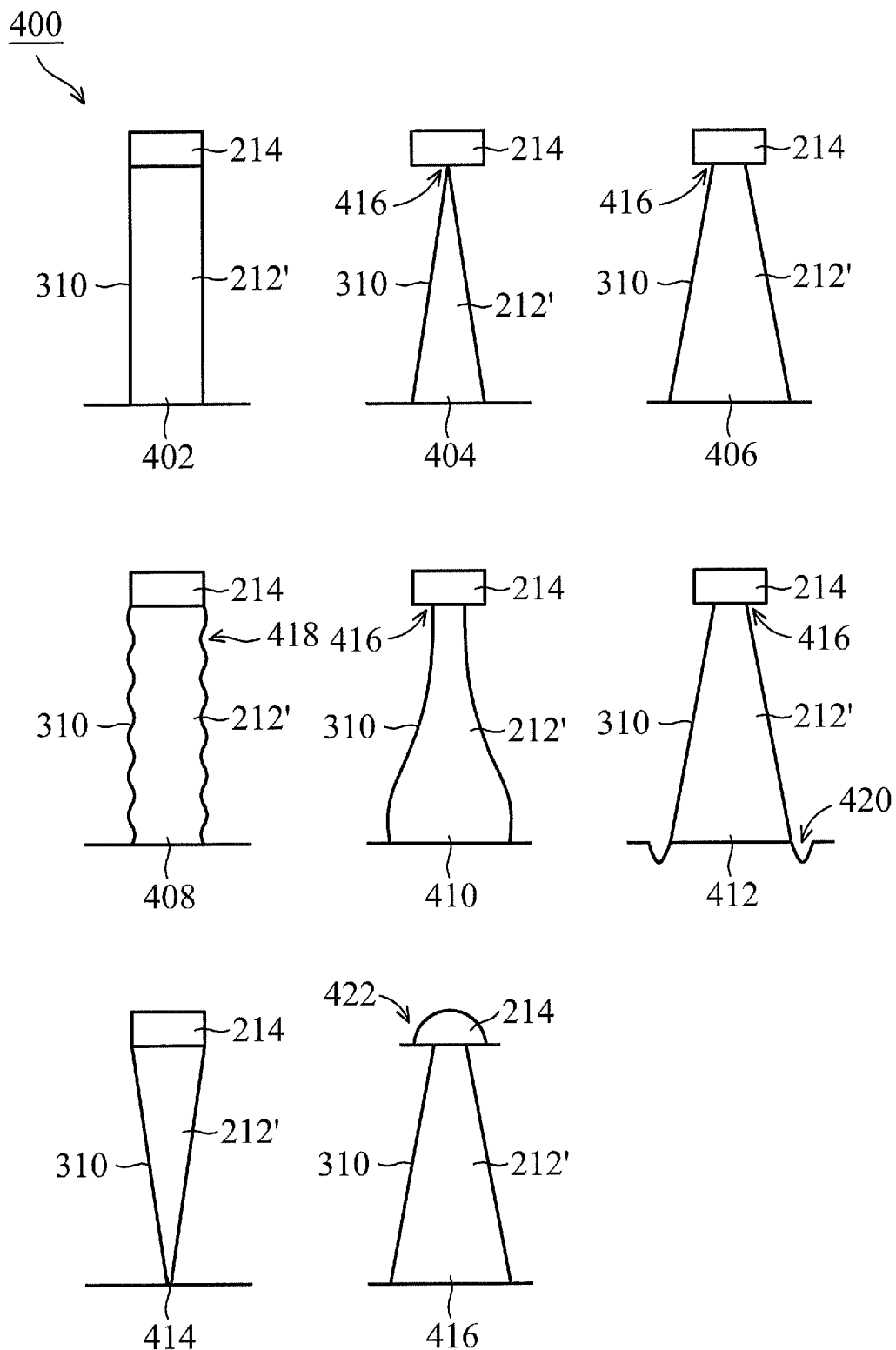
FIG. 4 illustrates exemplary cross-sectional views of sidewall profiles of etched openings in a collimator structure, in accordance with some embodiments of the present disclosure.

FIG. 4 illustrates various sidewall profiles 400 of a via hole etched in a second dielectric layer 214 and a thinned second substrate 212' in a semiconductor device 300, in accordance with some embodiments of the present disclosure. The various sidewall profiles 400 comprises a first profile 402 with vertical sidewalls 310 from an ideal etching condition, a second profile 404 with tapered sidewalls 310 and complete undercuts 416 under the second dielectric layer 214 caused by a strong sidewall passivation, a third profile 406 with tapered sidewalls 310 and partial undercuts 416 under the second dielectric layer 214 caused by a spontaneous etching reaction, a fourth profile 408 with sidewalls 310 comprising ripples 418, a fifth profile 410 with smoothly curved sidewalls 310, a sixth profile 412 with tapered sidewalls 310 and notches 420 at the bottom of via hole in the thinned second substrate 212' caused by distorted ion trajectories and/or chemical etching, a seventh profile 414 with inverted tapering sidewalls 310, and an eighth profile 416 with tapered sidewalls 310 and eroded corners 422 in the second dielectric layer 214. It should be noted that sidewall profiles in the FIG. 4 is for illustration purposes and not intended to be limiting. Different sidewall profiles that can be obtained from various etching conditions are all within the scope of this invention. It should be noted FIG. 4 is for illustration purposes and is not intended to be limiting. Different profiles of the sidewalls 310 of the via holes 220 can be fabricated and used, which are within the scope of this invention.

Figure 5A:
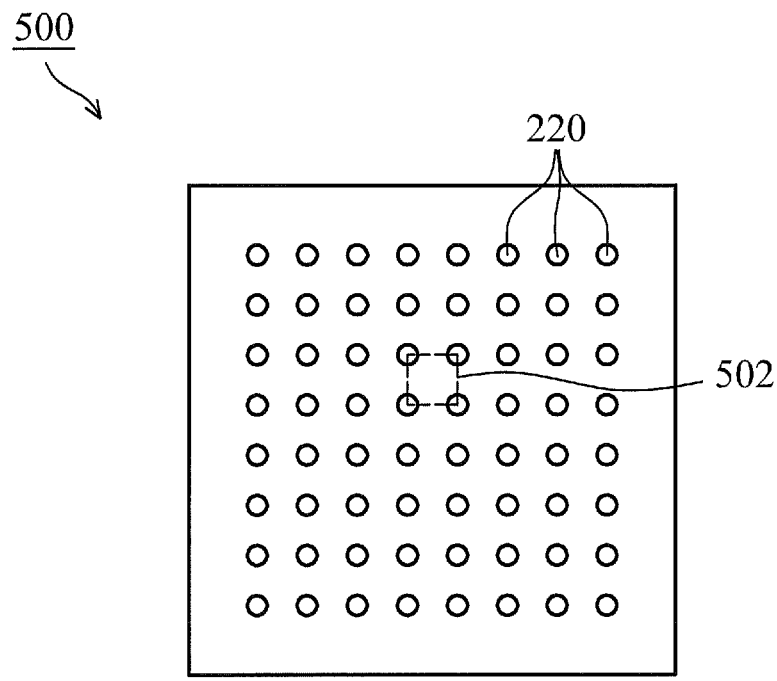
FIG. 5A illustrates an exemplary top view of a semiconductor device with a collimator, in accordance with some embodiments of the present disclosure.

FIG. 5A illustrates an exemplary top view of a semiconductor device 500 with a collimator structure, in accordance with some embodiments of the present disclosure. The collimator structure in the device 500 comprises 64 via holes 220. In the illustrated embodiments, the via holes 220 each has a circular cross section. In some other embodiments, different shapes (e.g., square) of cross sections of the via holes 220 can be used and are within the scope of this invention. In the illustrated embodiments, the via holes 220 are arranged in a 8×8 array with a square unit cell 502. It should be noted the device 500 in FIG. 5A is for illustration purposes, any numbers of via holes 220 can be used and is within the scope of this invention.

Figure 5B:
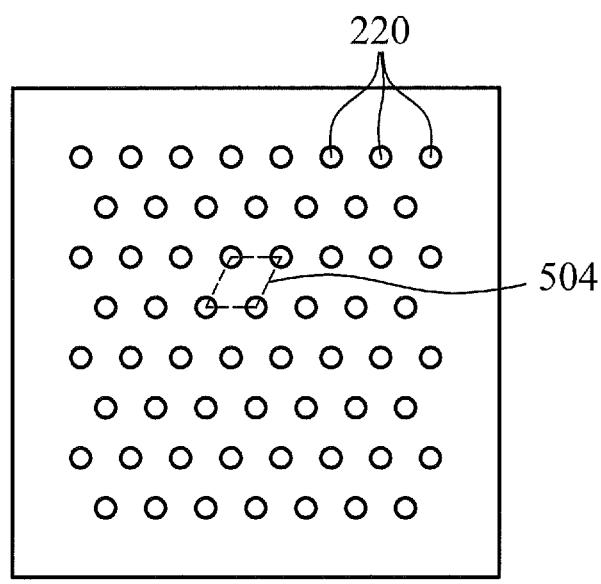
FIG. 5B illustrates an exemplary top view of a semiconductor device with a collimator, in accordance with some embodiments of the present disclosure.

FIG. 5B illustrates an exemplary top view of a semiconductor device 500 with a collimator structure, in accordance with some embodiments of the present disclosure. The collimator structure in the device 500 comprises 60 via holes 220. In the illustrated embodiments, the via holes 220 each has a circular cross section. In some other embodiments, different shapes (e.g., square) of cross sections of the via holes 220 can be used and are within the scope of this invention. In the illustrated embodiments, the via holes 220 are arranged in an array with a diamond unit cell 504. It should be noted the device 500 in FIG. 5A is for illustration purposes, any numbers of via holes 220 can be used and is within the scope of this invention.

In one embodiment, an optical collimator, includes: a dielectric layer; a substrate; and a plurality of via holes, wherein the dielectric layer is formed over the substrate, wherein the plurality of via holes are configured as an array along a lateral direction of a first surface of the dielectric layer, wherein each of the plurality of via holes extends through the dielectric layer and the substrate from the first surface of the dielectric layer to a second surface of the substrate in a vertical direction, wherein the substrate has a bulk impurity doping concentration equal to or greater than $1\times10^{19}$ per cubic centimeter ($cm^{-3}$) and a first thickness, and wherein the bulk impurity doping concentration and the first thickness of the substrate are configured so as to allow the optical collimator to filter light in a range of wavelengths.

In another embodiment, a semiconductor device, includes: at least one optical sensing element; and an optical collimator; wherein the optical collimator comprises: a first dielectric layer, a first substrate, and a plurality of via holes, wherein the first dielectric layer is formed over the first substrate, wherein the plurality of via holes are configured as an array along a lateral direction of a first surface of the first dielectric layer, wherein each of the plurality of via holes extends through the first dielectric layer and the first substrate from the first surface of the first dielectric layer to a second surface of the first substrate in a vertical direction, wherein the first substrate has a bulk impurity doping concentration equal to or greater than $1\times10^{19}$ per cubic centimeter ($cm^{-3}$) and a first thickness, and wherein the bulk impurity doping concentration and the first thickness of the first substrate are configured so as to allow the optical collimator to filter light in a range of wavelengths.

Yet, in another embodiment, a method for forming a semiconductor device, includes: forming a collimator structure on a first substrate with a first dielectric layer, wherein the collimator structure comprises a plurality of via holes, wherein each of the plurality of via holes extends through a second dielectric layer and a second substrate from a first surface of the second dielectric layer to a second surface of the second substrate in a vertical direction, wherein the second substrate has a bulk impurity doping concentration equal to or greater than $1\times10^{19}$ per cubic centimeters ($cm^{-3}$) and a first thickness, and wherein the bulk impurity doping concentration and the first thickness of the second substrate are configured so as to allow the collimator structure to filter light in a range of wavelengths.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical collimator, comprising:
a dielectric layer;
a substrate; and
a plurality of via holes,
wherein the dielectric layer is formed over the substrate, wherein each of the plurality of via holes extends through the dielectric layer and the substrate from a first surface of the dielectric layer to a second surface of the substrate in a vertical direction, wherein a first thickness of the substrate is equal to or greater than 75 micrometers, a second thickness of the dielectric layer is in a range of 1.5-2.5 micrometers, and the optical collimator is configured to filter light in a range of wavelengths.

2. The optical collimator of claim 1, wherein the substrate comprises silicon.

3. The collimator of claim 1, wherein each of the plurality of via holes has a diameter in a range of 3-5 micrometers.

4. The collimator of claim 1, wherein the dielectric layer comprises silicon dioxide.

5. The collimator of claim 1, wherein a bulk impurity doping concentration of the substrate and the first thickness of the substrate are configured so as to allow the optical collimator to filter light in a range of wavelengths between 780 and 1100 nanometers.

6. The collimator of claim 5, wherein the substrate has a bulk impurity doping concentration equal to or greater than $1\times1019$ per cubic centimeter (cm-3).

7. The collimator of claim 1, wherein the plurality of via holes are configured as an array along a lateral direction of the first surface of the dielectric layer.

8. A semiconductor device, comprising:
at least one optical sensing element; and
an optical collimator;
wherein the optical collimator comprises: a first dielectric layer, a first substrate, and a plurality of via holes, wherein the first dielectric layer is formed over the first substrate, wherein each of the plurality of via holes extends through the first dielectric layer and the first substrate, and wherein a bulk impurity doping concentration and a first thickness of the first substrate are configured so as to allow the optical collimator to filter light in a range of wavelengths between 780 and 1100 nanometers.

9. The semiconductor device of claim 8, wherein the at least one optical sensing element is formed in a second substrate, wherein the second substrate is further coated with a second dielectric layer, and wherein the optical collimator is formed over the second dielectric layer.

10. The semiconductor device of claim 8, wherein the first substrate comprises silicon.

11. The semiconductor device of claim 8, wherein a first thickness of the first substrate is equal to or greater than 75 micrometers.

12. The semiconductor device of claim 8, wherein a second thickness of the first dielectric layer is in a range of 1.5-2.5 micrometer.

13. The semiconductor device of claim 8, wherein the plurality of via holes are configured as an array along a lateral direction of a first surface of the first dielectric layer and each of the plurality of via holes has a diameter in a range of 3-5 micrometers.

14. The semiconductor device of claim 8, wherein the first dielectric layer comprises silicon dioxide.

15. The semiconductor device of claim 8, wherein the first substrate has a bulk impurity doping concentration equal to or greater than $1\times1019$ per cubic centimeter (cm-3).

16. A method for forming a collimator, comprising:
forming a dielectric layer a substrate;
forming a plurality of via holes each extending through the dielectric layer and the substrate from a first surface of the dielectric layer to a second surface of the substrate in a vertical direction,
wherein a first thickness of the substrate is equal to or greater than 75 micrometers, a second thickness of the dielectric layer is in a range of 1.5-2.5 micrometers, and the optical collimator is configured to filter light in a predetermined range of wavelengths.

17. The method of claim 16, wherein the dielectric layer comprises silicon dioxide.

18. The method of claim 16, wherein a bulk impurity doping concentration of the substrate and the first thickness of the substrate are configured so as to allow the optical collimator to filter light in a range of wavelengths between 780 and 1100 nanometers.

19. The method of claim 18, wherein the substrate has a bulk impurity doping concentration equal to or greater than $1 \times 10^{19}$ per cubic centimeter (cm-3).

20. The method of claim 16, wherein the plurality of via holes are configured as an array along a lateral direction of the first surface of the dielectric layer and each of the plurality of via holes has a diameter in a range of 3-5 micrometers.

* * * * *